United States Patent [19]

Mogab et al.

[11] Patent Number: 5,464,711
[45] Date of Patent: Nov. 7, 1995

[54] PROCESS FOR FABRICATING AN X-RAY ABSORBING MASK

[75] Inventors: C. Joseph Mogab, Austin, Tex.; William J. Dauksher, Mesa; Douglas J. Resnick, Phoenix, both of Ariz.

[73] Assignee: Motorola Inc., Schumburg, Ill.

[21] Appl. No.: 283,325

[22] Filed: Aug. 1, 1994

[51] Int. Cl.$^6$ ............................................. G03F 9/00
[52] U.S. Cl. ........................... 430/5; 430/311; 430/313; 430/330; 378/34; 378/35
[58] Field of Search ................................. 430/5, 311, 313, 430/330; 378/34, 35

[56] References Cited

U.S. PATENT DOCUMENTS

| | | | |
|---|---|---|---|
| 4,957,834 | 9/1990 | Matsuda et al. | 430/5 |
| 4,971,851 | 11/1990 | Neukermans et al. | 428/137 |
| 5,188,706 | 2/1993 | Hori et al. | 430/5 |

FOREIGN PATENT DOCUMENTS

| | | |
|---|---|---|
| 0346828 | 12/1989 | European Pat. Off. . |
| 63-252428 | 10/1988 | Japan . |

OTHER PUBLICATIONS

T. Inoue, et al., Pattern formation in amorphous WNx by low temperature electron cyclotron resonance etching for fabrication of x-ray mask, J.Vac.Sci. Technol.B 11(6), Nov./Dec. 1993.

T. Inoue, et al., Pattern formation in amorphous WNx by low temperature electron cyclotron resonance etching for fabrication of x-ray mask, 37th Int. Symp. Elect. Ion Photon Beams, Jun. 1–4, '93.

R. R. Kola, Mask Metallization, 5th ARPA Adv. Lith. Program Review, Fort Meyers, Fla., 24 Jan. 1994.

*Primary Examiner*—S. Rosasco
*Attorney, Agent, or Firm*—Jasper W. Dockrey

[57] ABSTRACT

A process for the fabrication of an X-ray absorbing mask includes providing a silicon substrate (10) having a front surface (16) and a back surface (18). A membrane layer (12) is formed on the front surface (16). In one embodiment of the invention, an etch stop layer (14) and an X-ray absorbing layer (20) are sequentially formed over the membrane layer (12). In a preferred embodiment, the X-ray absorbing layer (20) is tantalum silicon nitride deposited by RF sputter deposition directly onto the layers overlying the silicon substrate (10). The structure is then annealed at a temperature sufficient to reduce the internal stress in the X-ray absorbing layer (20). Finally, the X-ray absorbing layer is patterned to form a masking pattern (30, 36) on the membrane layer (12).

15 Claims, 2 Drawing Sheets

PROCESS FOR FABRICATING AN X-RAY ABSORBING MASK

FIELD OF THE INVENTION

This invention relates, in general, to the fabrication of semiconductor devices, and more particularly, to a process for the fabrication of an X-ray absorbing mask for use in defining geometric patterns during semiconductor device fabrication.

BACKGROUND OF THE INVENTION

Within the field of semiconductor fabrication technology, the area of lithographic processing is characterized by a continuing need to decrease the minimum feature size of components within an integrated circuit. Therefore, each new generation of advanced integrated circuits has required an increase in lithographic resolution. Traditionally, optical lithography has been used to define integrated circuit patterns on semiconductor substrates. However, current optical lithography systems have great difficulty defining photoresist patterns with feature sizes of less than about 0.35 microns. A present need exists for the fabrication of integrated circuits having feature sizes approaching about 0.25 microns.

In view of the limitations of optical lithography systems, X-ray lithography technology is under development to meet the needs of the next generation of integrated circuits. The extremely short wave length of X-ray radiation eliminates the diffraction effects that limit the resolution of optical lithography systems. The elimination of diffraction effects, associated with the use of X-ray radiation, provides resolution capability far exceeding that of optical lithography. In addition, X-ray lithography also affords the advantage of a greater depth of focus and relative insensitivity to particulate contamination which may be present in the lithographic system during pattern generation. The ability of X-ray radiation to penetrate a wide variety of substances makes the X-ray lithography process less sensitive to many systematic defects that limit optical lithography, such as reflection, refraction, and particulate contamination.

At present, the preferred technique for X-ray lithography is proximity printing using a synchrotron radiation source. For proximity printing, it is necessary to make a mask having the same feature sizes as that desired to be printed on the semiconductor substrate. Thus, the mask making process is one of the key technologies necessary for the practice of X-ray lithography.

A major impediment in the development of X-ray masks has been the identification of materials, which meet the demanding criteria for high precision mask fabrication. For example, many materials will not absorb X-ray radiation to an extent sufficient for use as an X-ray absorbing layer. Typically, materials are selected which have a high atomic number and are capable of being patterned by high resolution methods, such as E-beam lithography and reactive ion etching. Initially, gold was used as the X-ray absorbing material and deposited onto a membrane layer. Gold possesses many desirable physical characteristics, such as smoothness and low internal stress. However, gold is a contaminant in a semiconductor device, and therefore gold and gold alloys are being abandoned in favor of refractory metals.

Present X-ray mask development work has centered on refractory metals, such as tungsten and tantalum, for use as an X-ray absorbing layer. In addition, several materials have been developed for use as membrane layers because of their relative durability and transparency to X-ray radiation. For example, membranes have been fabricated from silicon, silicon nitride, silicon carbide, and diamond.

While the foregoing materials possess the necessary absorption and transmission characteristics, a major drawback to their use has been the creation of high internal stress in an X-ray absorbing mask fabricated from these materials. High internal stress in an X-ray absorbing mask creates spatial distortions which compromise the pattern definition capability of X-ray lithography. Accordingly, further development in mask fabrication techniques is necessary to minimize the degree of internal stress present in advanced X-ray absorbing masks.

SUMMARY OF THE INVENTION

In practicing the present invention there is provided a process for fabricating an X-ray absorbing mask, in which an X-ray absorbing layer is deposited as an amorphous material and subsequently annealed to relieve internal stress. In one embodiment of the invention, a silicon substrate is provided having a front surface and a back surface. A membrane layer is formed on the front surface and an X-ray absorbing layer is formed to overlie the membrane layer. The X-ray absorbing layer is an amorphous material containing at least one of Ta, Hf, Re, a FeW alloy, SiW alloy, a TaFe alloy, or a material composed of a refractory metal and silicon, or a material composed of a refractory metal, silicon, and nitrogen. After the X-ray absorbing layer is formed on the membrane layer, the structure is annealed to reduce the internal stress in the X-ray absorbing layer. Finally, the X-ray absorbing layer is patterned to define a masking pattern.

Figure 1:
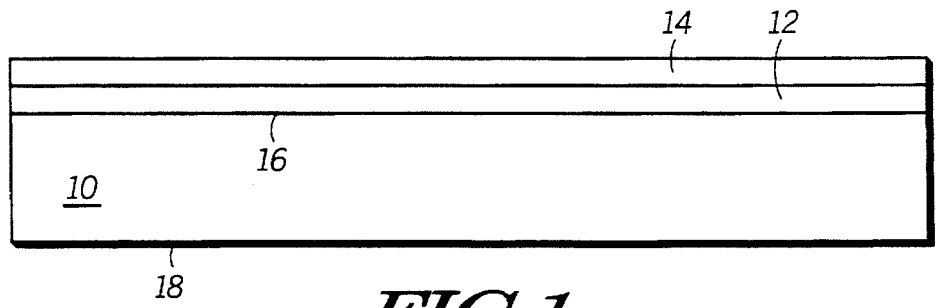
FIGS. 1–4 illustrate, in cross-section, process steps for the fabrication for an X-ray absorbing mask in accordance with one embodiment of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides a process for the fabrication of an X-ray absorbing mask for use in semiconductor device processing. The X-ray absorbing mask fabricated in accordance with the invention exhibits strong spectral absorption at wavelengths of about 10 angstroms. The X-ray absorbing mask of the invention is ideally suited for proximity X-ray lithography, in which integrated circuit components having feature sizes less than about 0.25 microns are defined.

In the present invention, an X-ray absorbing mask is provided having minimal stress-related geometric distortion. To achieve reduced stress, an X-ray absorbing material having an amorphous microstructure and a high mass absorption coefficient is deposited onto a membrane layer, which, in turn, overlies a silicon substrate. The structure is then annealed to attain a near zero internal stress state.

The amorphous deposition of an X-ray absorbing material offers several advantages in the fabrication of an X-ray absorbing mask. Because the material is devoid of grains, masking patterns etched into the amorphous material do not exhibit line-edge roughness. Also, because the line-edges are smooth, defect detection errors are minimized during pattern inspection of the mask after mask fabrication. In addition, the absence of grains in the X-ray absorbing material reduces notching during mask repair using a focused ion beam repair tool.

A further advantage of the invention is realized by the formation of an X-ray absorbing material directly onto a silicon substrate. In the prior art, X-ray absorbing layers are deposited after major portions of the mask, such as the membrane and support ring, are fabricated. This practice can lead to the formation of an X-ray absorbing layer having a radial stress gradient. By forming the X-ray absorbing layer on a substrate, radial stress gradients in the absorbing layer are avoided. Accordingly, the annealing process functions to reduce the internal stress present in the as-deposited X-ray absorbing material. Moreover, since the deposition and annealing processes are carried out with a conventional silicon substrate, conventional semiconductor fabrication processes can be used to fabricate the X-ray absorbing mask.

The advantages of the invention described above will be better understood following a description of the fabrication of an X-ray absorbing mask in accordance with the invention. FIGS. 1–4 illustrate, in cross-section, the fabrication of an X-ray absorbing mask in accordance with one embodiment of the invention.

Shown in FIG. 1, is a conventional silicon substrate 10 upon which a membrane layer 12 and an etch stop layer 14 have been deposited. Silicon substrate 10 preferably has a thickness of about 0.125 to 10 millimeters, and most preferably a thickness of about 0.375 millimeters. Silicon substrate 10 is preferably a body of silicon sliced from a Czochralski-grown silicon ingot having a (1,0,0) crystalline orientation. Membrane layer 12 is preferably silicon nitride, chemical vapor deposited to a thickness of about 0.5 to 5 microns. The silicon nitride is initially deposited onto a front surface 16 and a back surface 18 of silicon substrate 10. The silicon nitride deposited onto back surface 18 is subsequently removed prior to forming etch stop layer 14. In addition to silicon nitride, other materials such as silicon carbide, epitaxial silicon doped with a conductivity determining dopant, and diamond, and the like, can also be used to form membrane layer 12. Etch stop layer 14 is preferably a metal layer, which is differentially etchable with respect to X-ray absorbing materials. In one embodiment, etch stop layer 14 is chrome deposited to a thickness of about 200 angstroms.

Figure 2:
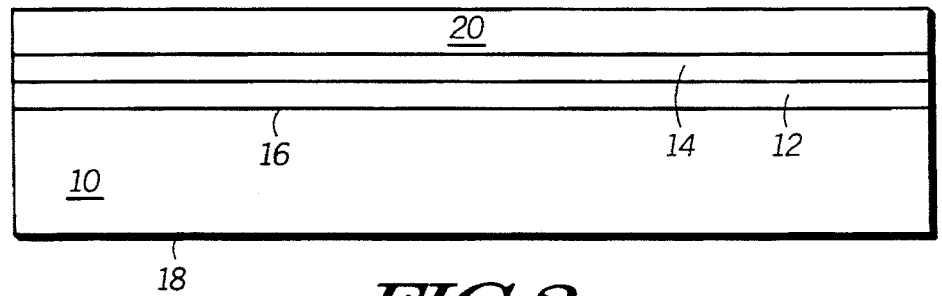

Following the formation of etch stop layer 14, an X-ray absorbing layer 20 is deposited to overlie etch stop layer 14, as illustrated in FIG. 2. The X-ray absorbing layer of the invention is fabricated from a material that can be deposited as an amorphous material, and that can be annealed to relax the internal stress to a near zero stress state. The annealing temperature necessary to completely relax the internal stress is sufficiently high such that subsequent high temperature processing in the mask fabrication process will not alter the internal stress. For example, after depositing the amorphous X-ray absorbing layer, it is annealed at a temperature of 400° C. to completely relieve internal stress. Subsequent fabrication processes are then carried out at temperatures below 400° C., which will not alter the internal stress of the X-ray absorbing layer. Furthermore the annealing temperature is below the crystallization temperature of the X-ray absorbing material.

Preferably, X-ray absorbing layer 20 is a material having as one component an element having a high atomic number and composing at least 75, and most preferably 86 weight percent of the material. The high atomic number element is preferably a refractory metal, such as, rhenium (Re), hafnium (Hf), and most preferably tantalum (Ta). The remaining elements of the X-ray absorbing material are preferably nitrogen and silicon. Alternatively, the X-ray absorbing material can be a binary metal alloy, such as iron-tungsten (FeW), silicon-tungsten (SiW), and tantalum-iron (TaFe). In a preferred embodiment, the X-ray absorbing material is tantalum silicon nitride having the chemical formula $Ta_xSi_yN_z$, where x is a real number from 20 to 99, y is a real number from 0 to 80, and z is a real number from 0 to 80, and where x, y, and z, sum to 100. In the most preferred embodiment, the stoichiometric formula is represented as $Ta_{36}Si_{14}N_{50}$.

Preferably, X-ray absorbing layer 20 is deposited by an RF sputter deposition process to a thickness of about 3000 to 10000 angstroms and most preferably about 6000 angstroms. In the sputter deposition process, silicon substrate 10 is placed in the deposition chamber of the RF sputtering apparatus, and X-ray absorbing layer 20 is directly sputter deposited onto etch stop layer 14.

Although RF sputter deposition is the preferred method for the formation of the absorber layer, other deposition methods are contemplated by the present invention. For example, focused ion beam deposition, metal-organic chemical vapor deposition (MOCVD), electroplating, and the like, are within the scope of the invention. Those skilled in the art will appreciate that the most effective deposition method will vary depending upon, among others, the physical and chemical properties of the particular X-ray absorbing material, and the surface characteristics of the membrane layer.

Once X-ray absorbing layer 20 is deposited, an annealing process is carried out to reduce the compressive stress present in the as-deposited X-ray absorbing layer. The annealing process can be carried out by various methods and in the presence of different gas ambients. For example, X-ray absorbing layer 20 can be annealed in a convection furnace, a rapid thermal annealing apparatus, or a thermal hot plate. Additionally, the annealing process can be carried out in air, nitrogen, argon, an argon-nitrogen mixture, and the like.

In a preferred embodiment, the annealing process is carried out in two steps, where a first annealing step is performed at a temperature of about 350°–500° C. After the first annealing step, stress measurements can be made of the annealed X-ray absorbing layer and further annealing performed as necessary to achieve a near zero stress state. Accordingly, a second annealing process is then carried out to further reduce the internal stress in the X-ray absorbing layer. The specific annealing conditions necessary to attain a zero stress state in the X-ray absorbing layer depends upon numerous parameters, such as the film deposition conditions, the stoichiometric relationship of the elements in the X-ray absorbing layer, and the like.

Figure 3:
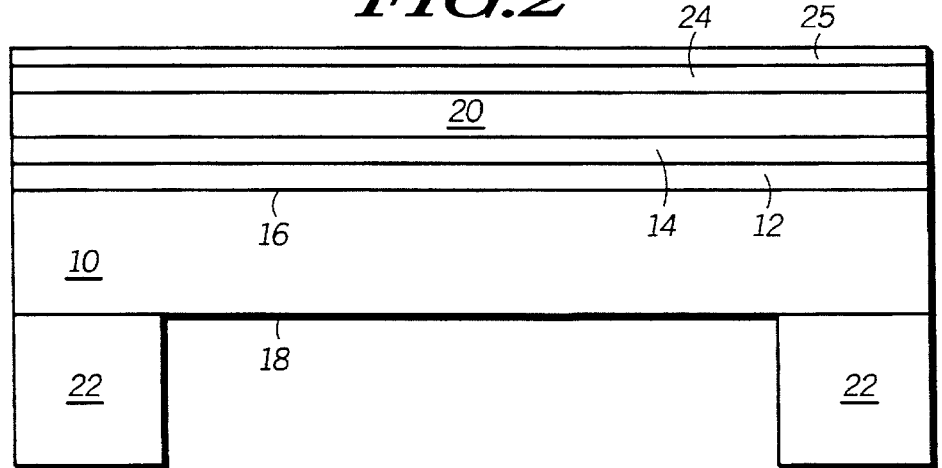

After annealing X-ray absorbing layer 20, a support ring 22 is bonded to back surface 18 of silicon substrate 10, as illustrated in FIG. 3. Support ring 22 is preferably a glass material sold under the tradename "Pyrex." Support ring 22 is preferably attached to silicon substrate 10 by an anodic bonding process carried out at about 350° C., and at an applied potential of about 2000 volts. Next, process steps are carried out to define a masking pattern in X-ray absorbing layer 20. In one method, a hard mask layer 24 is deposited to overlie X-ray absorbing layer 20. Preferably, hard mask layer 24 is a metal, which is differentially etchable with respect to X-ray absorbing layer 20. In one embodiment, hard mask layer 24 is formed from a material similar to etch stop layer 14. For example, both etch stop layer 14 and hard mask layer 24 are formed by the deposition of a layer of chrome. Alternatively, etch stop layer 14 and hard mask layer 24 can be formed from different materials. Preferably, hard mask layer 24 is elemental chrome deposited to a thickness of about 30 nanometers.

Those skilled in the art will recognize that process sequences other than that illustrated in FIGS. 1–3 can be used in the assembly the X-ray absorbing mask of the invention. For example, hard mask layer 24 can be deposited prior to bonding support ring 22 to substrate 10. Further, hard mask layer 24 can be deposited prior to annealing X-ray absorbing layer 20. Accordingly, all such variations and modifications are within the scope of the present invention.

Once hard mask layer 24 is deposited, an insulating layer 25 is formed to overlie hard mask layer 24, as illustrated in FIG. 3. Insulating layer 25 is preferably, silicon dioxide deposited by low pressure chemical vapor deposition (LPCVD). Insulating layer 25 functions to protect hard mask layer from attack by etchants used in the subsequent silicon etching process.

Figure 4:
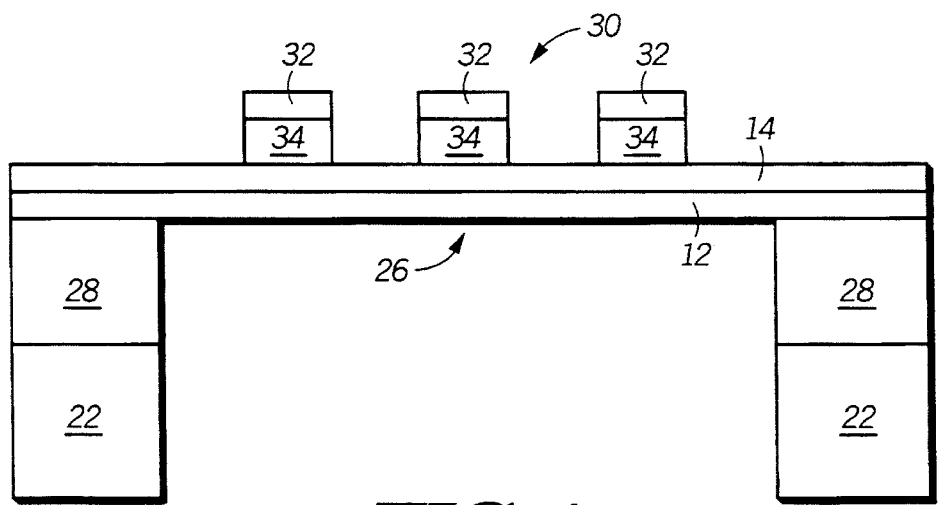

The inventive process continues as illustrated in FIG. 4. After depositing hard mask 24, back surface 18 of silicon substrate 10 is etched using support ring 22 as an etching mask. The silicon etching process etches away a portion of substrate 10 and exposes a membrane surface 26. The etching process leaves substrate portions 28 intermediate to support ring 22 and membrane layer 12. During the silicon etching process, insulating layer 25 protects X-ray absorbing layer 20 from attack by the chemical constituents of the silicon etchant. Preferably, a wet etching process is used to etch back surface 18. In one embodiment, a wet etching bath is employed containing a ethylene diamine pyrocatechol (EDP), which is maintained in a temperature of about 100° C. Alternatively, a potassium hydroxide solution, or a mixture of nitric acid, hydrofluoric acid and acetic acid can be used. Furthermore, a dry plasma silicon etching process or other dry etching technique can be used to etch back surface 18. Once back surface 18 is etched, insulation layer 25 is removed.

After exposing membrane surface 26, a masking pattern is generated in X-ray absorbing layer 20. In one embodiment of the invention, a lithographic mask (not shown) is formed on hard mask layer 24. The lithographic mask is preferably an E-beam resist, which is patterned by exposure to electron beam radiation followed by chemical development. Hard mask layer 24 is subsequently etched to transfer the lithographic pattern to hard mask layer 24. In the case of a chrome hard mask, a reactive ion etching process is performed to etch hard mask layer 24 using chlorinated etching gases. Next, X-ray absorbing layer 20 is etched using hard mask layer 24 as an etch mask. Preferably, the E-beam resist remains in place during the reactive ion etching process and is eroded away during the etching process. Alternatively, the resist can be removed prior to performing the etching process.

Those skilled in the art will recognize that hard mask layer 24 is only necessary if the E-beam resist cannot withstand the etching conditions necessary to form a pattern in X-ray absorbing layer 20. Accordingly, in the case where the E-beam resist is capable of providing sufficient protection to the underlying X-ray absorbing material, hard mask 24 becomes an optional layer in the process of the invention.

As illustrated in FIG. 4, the sequential etching process forms a masking pattern 30. Masking pattern 30 includes portions 32 of hard mask layer 24 overlying portions 34 of X-ray absorbing layer 20. During the sequential etching process, etch stop layer 14 prevents the etching species from attacking membrane layer 12.

The X-ray mask, fabricated in accordance with the invention, provides an X-ray mask with reduced radial stress gradients. The process of the invention produces a low-stress X-ray mask while avoiding the necessity of performing special stress control processes. For example, in-situ stress control techniques, such as backside cooling during absorber deposition, low power deposition, and deposition through an aperture, and the like, are avoided. Furthermore, in the case of a tantalum silicon nitride absorbing material, the internal stress of the X-ray absorbing layer is stable at processing temperatures below the annealing temperature.

The X-ray mask illustrated in FIG. 4 can be used directly for the fabrication of semiconductor devices employing X-ray lithography for pattern definition. Although unnecessary for the direct application of the X-ray absorbing mask illustrated in FIG. 4, hard mask portions 32 overlying absorber portions 34 can be removed prior to utilization of the X-ray absorbing mask for the fabrication of semiconductor devices. Additionally, portions of etch stop layer 14 overlying membrane 12 can also be removed prior to use. Hard mask portions 32 can be removed, for example in the case of a chrome hard mask, by reactive ion etching using chlorinated etching gases coupled with backside cooling of the membrane during the etching process. Similar etching processes can also be used to remove portions of etch stop layer 14 overlying membrane layer 12 and not protected by absorber portions 34. In an alternative etching process, hard mask portions 32 and portions of etch stop layer 14 can be removed by a wet chemical etching process. For example, the chemical etchant ceric ammonium nitrate can be used to remove a chrome hard mask and etch stop material.

Figure 5:
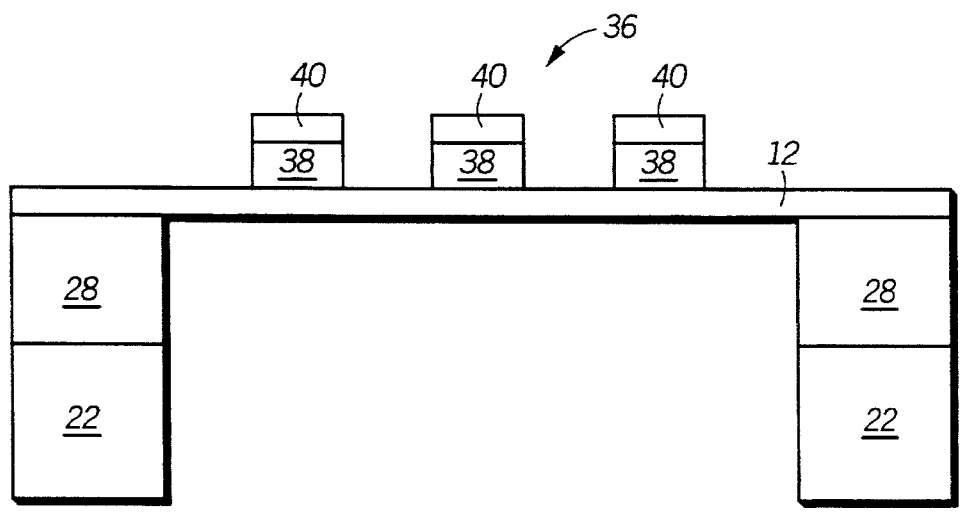
FIG. 5 illustrates, in cross-section, an X-ray absorbing mask fabricated in accordance with another embodiment of the invention.

An alternative embodiment of the invention is illustrated in FIG. 5. In the alternative embodiment, a masking pattern 36 is formed on membrane layer 12. Masking pattern 36 includes X-ray absorbing portions 38 and dielectric portions 40. Dielectric portions 40 limit the back scattering of electrons during the exposure of an E-beam resist used to define masking pattern 36. The E-beam resist process is similar to that previously described. During the exposure of the E-beam resist, electrons can be backscattered by the high atomic weight elements present in the X-ray absorbing material used to form X-ray absorbing portions 38. The backscattering of electrons causes a variation in feature definition of the E-beam resist. The problem is especially severe in portions of the resist pattern containing features in close proximity. Accordingly, dielectric portions 40 reduce line width variation in the patterned E-beam resist caused by electron back scattering.

Dielectric portions 40 are preferably formed by depositing a dielectric layer on the surface of the X-ray absorbing layer after forming the X-ray absorbing layer on membrane layer 12. Alternatively, a dielectric material can be formed by oxidizing the X-ray absorbing layer. Once the dielectric layer is formed, an E-beam resist (not shown) is deposited and patterned by electron beam lithography. Then, a sequential etching process is used to etch the dielectric layer and the underlying X-ray absorbing layer. In a further processing method, dielectric portions 40 can be formed by oxidizing the X-ray absorbing layer after patterning the layer to form X-ray absorbing portions 38. In this case, dielectric portions 40 will extend over the entire surface of the X-ray absorbing portions 38.

In the alternative embodiment, an etch stop layer is not used and the X-ray absorbing layer is etched directly using membrane layer 12 as an etch stop layer. However, an etch stop layer similar to that previously described can be provided if necessary to prevent the attack of etchant species on the membrane layer. The process steps used for the fabrication of support ring 22 and substrate portions 28 are identical to those described for the fabrication of the X-ray absorbing mask illustrated in FIG. 4.

Without further elaboration, it is believed that one skilled in the art can, using the preceding description, utilize the invention to its fullest extent. The following example of preferred specific embodiment is, therefore, to be construed as merely illustrative, and not limitative of the remainder of the disclosure in any way whatsoever.

EXAMPLE

A tantalum silicon nitride layer having the stoichiometric formula $Ta_{36}Si_{14}N_{50}$ was deposited onto 300 angstroms of chrome overlying a silicon nitride membrane layer. The internal stress of the as-deposited tantalum silicon nitride layer was measured by laser deflection using an FSM8800 manufactured by Frontier Semiconductor Measurement of San Jose, Calif. Using this technique, the internal stress was determined be compressive, and to have a value of about $-5 \times 10^9$ dynes/cm2. The tantalum silicon nitride layer was sputter deposited using a $Ta_5Si_3$ target mounted in an RF magnetron sputtering apparatus. The sputtering apparatus has a deposition chamber 18 inches in diameter and a depth of 12 inches. To initiate the sputtering process, the deposition chamber was evacuated to a pressure of $2 \times 10^7$ torr. The base pressure was maintained while 55.4 sccm of argon and 4.6 sccm of nitrogen were introduced to the deposition chamber. Three hundred watts of RF power was applied to the target while maintaining a deposition pressure of about 10 millitorr. The deposition process was then carried out for a period of time sufficient to deposit a tantalum silicon nitride layer having a thickness of about 4000 angstroms.

Using the foregoing deposition methods, a series of substrates were prepared having 4000 angstrom tantalum silicon nitride films. The amount of stress in each of the as-deposited tantalum silicon nitride films was measured using the previously described method. Each sample was then subsequently annealed at a predetermined temperature using a conventional hot plate manufactured by Cost Effective Equipment, a division of Brewer Science of Rolla, Mo. All samples were annealed for a period of 20 minutes. Following the annealing process, the stress of each tantalum silicon nitride layer was again measured.

Figure 6:
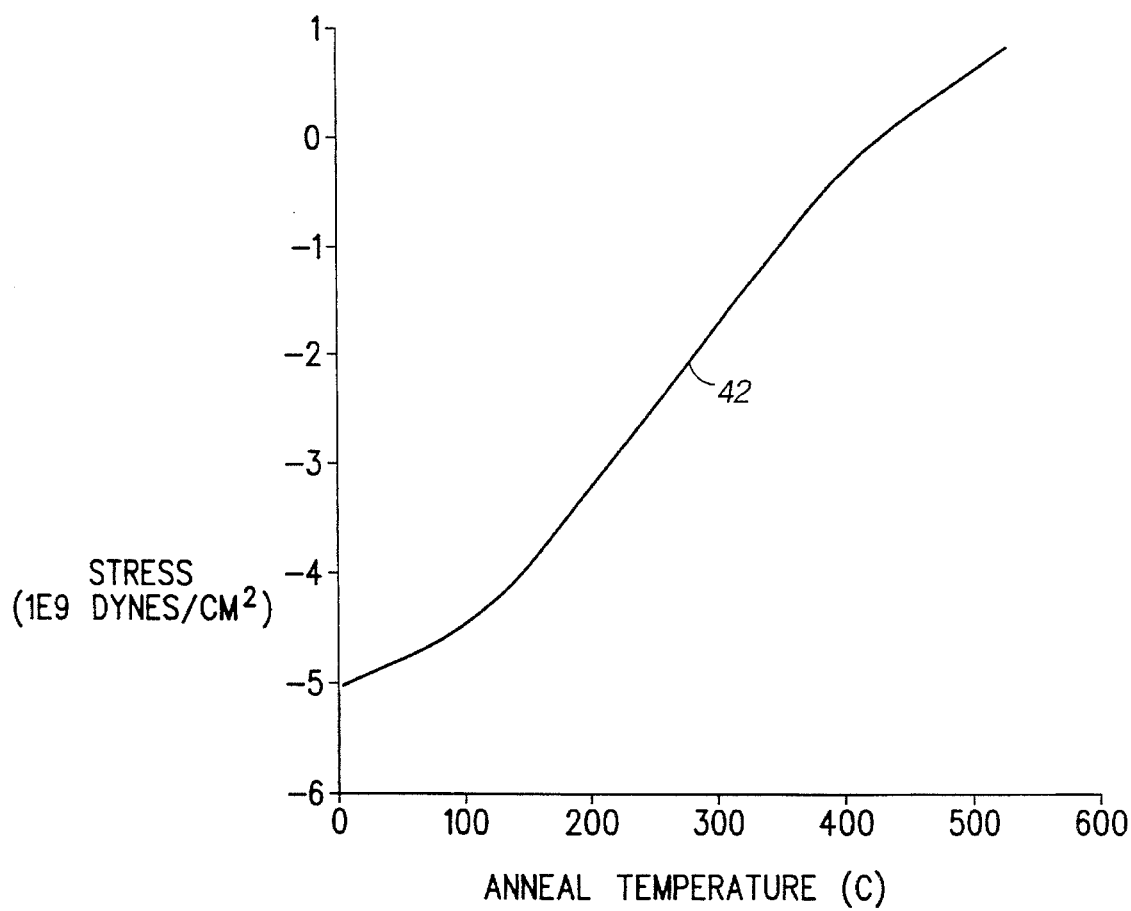
FIG. 6 is a plot of internal stress in an X-ray absorbing layer formed in accordance with the invention as a function of annealing temperature.

The stress measurement data obtained through the foregoing experimental procedure is illustrated in the plot of FIG. 6. The plot indicates a progressive reduction in stress as the annealing temperature is increased. A best fitting curve 42 plotted using the data points shows that a substantially unstressed tantalum silicon nitride film is obtained at an annealing temperature of about 425° C. The data indicates that an X-ray absorbing mask fabricated in accordance with the invention and having a tantalum silicon nitride film annealed at a temperature of about 425° C., will have substantially reduced geometric distortion.

Thus it is apparent that there has been provided, in accordance with the invention, a process for fabricating an X-ray absorbing mask which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a multi-chambered chemical vapor deposition apparatus can be used to sequentially deposit the etch stop layer and the x-ray absorbing layer. It is therefore intended to include within the invention all such variations and modifications as fall within the scope of the appended claims and equivalents thereof.

We claim:

1. A process for fabricating an X-ray absorbing mask for use in the fabrication of semiconductor devices comprising the steps of:

providing a silicon substrate having a front surface and a back surface;

forming a membrane layer on the front surface;

forming an X-ray absorbing layer to overlie the membrane layer, wherein the X-ray absorbing layer is an amorphous material selected from the group consisting of a material containing at least one of Hf or Re, an FeW alloy, and TaFe alloy, and a material composed of a refractory metal, silicon, and nitrogen;

annealing the X-ray absorbing layer to reduce internal stress therein; and patterning the X-ray absorbing layer to define a masking pattern.

2. The process of claim 1, wherein the step of annealing comprises subjecting the silicon substrate to elevated temperatures in the presence of an ambient selected from the group consisting of air and an inert gas.

3. The process of claim 2, wherein the step of annealing comprises the steps of:

performing a first annealing step at a predetermined temperature; and performing a second annealing step for a predetermined time period to further reduce the internal stress of the X-ray absorbing layer.

4. The process of claim 2, wherein the step of annealing comprises annealing in an inert gas selected from the group consisting of argon, nitrogen, and an argon-nitrogen mixture.

5. The process of claim 1, wherein the step of patterning the X-ray absorbing layer comprises the steps of:

depositing a hard mask layer to overlie the X-ray absorbing layer;

etching the hard mask layer to define a mask pattern; and etching the X-ray absorbing layer to transfer the mask pattern to the X-ray absorbing layer.

6. The process of claim 5 further comprising the step of forming an etch stop layer to overlie the membrane layer prior to forming the X-ray absorbing layer.

7. The process of claim 1 further comprising the step of forming a dielectric layer on the X-ray absorbing layer prior to the step of patterning the X-ray absorbing layer.

8. The process of claim 7, wherein the step of forming a dielectric layer comprises chemical vapor deposition.

9. A process for fabricating an X-ray absorbing mask for use in the fabrication of semiconductor devices comprising the steps of:

provideing a silicon substrate having a front surface and a back surface;

forming a membrane layer on the front surface, wherein the membrane layer is selected from the group consisting of silicon nitride, silicon carbide, doped silicon, and diamond;

forming a $Ta_xSi_yN_z$ layer to overlie the membrane layer, wherein x is a real number from 20 to 99, y is a real number from 0 to 80, and z is a real number from 0 to 80, where x, y, and z sum to 100;

annealing the $Ta_xSi_yN_z$ layer to reduce internal stress therein; and patterning the $Ta_xSi_yN_z$ layer to define a masking pattern.

10. The process of claim 9, wherein the step of annealing comprises annealing in the presence of an ambient selected from the group consisting of air, nitrogen, argon, and an argon-nitrogen mixture.

11. The process of claim 10, wherein the step of annealing further comprises the steps of:

performing a first anneal at a temperature of at least 350° C. and not more than 500° C.; and performing a second anneal for a predetermined time period to further reduce the internal stress in the $Ta_xSi_yN_z$ layer.

12. The process of claim 9, wherein the step of forming a $Ta_xSi_yN_z$ layer comprises sputter deposition onto the membrane layer using a sputtering target comprised of tantalum and silicon, wherein the sputter deposition is performed in the presence of a nitrogen ambient.

13. The process of claim 9 further comprising the steps of:

depositing a first layer of chrome to overlie the membrane layer prior to forming the $Ta_xSi_yN_z$ layer; and depositing a second layer of chrome to overlie the $Ta_xSi_yN_z$ layer prior to the step of patterning the $Ta_xSi_yN_z$ layer.

14. The process of claim 9, wherein the step of patterning the X-ray absorbing layer comprises the steps of:

depositing a chrome layer to overlie the $Ta_xSi_yN_z$ layer;

forming a photoresist pattern on the chrome layer;

etching the chrome layer to form a pattern therein; and etching the $Ta_xSi_yN_z$ layer using the chrome layer as an etching mask.

15. A process for fabricating an X-ray absorbing mask for use in the fabrication of semiconductor devices comprising the steps of:

providing a silicon substrate having a front surface and a back surface;

forming a membrane layer on the front surface;

forming an X-ray absorbing layer to overlie the membrane layer, wherein the X-ray absorbing layer is represented by the formula $A_xB_yN_z$, wherein A is selected from the group consisting of Ta, Ti, and Re, B is selected from the group consisting of Si and W, and N is nitrogen, and wherein x, y, and z are positive integers;

annealing the X-ray absorbing layer to reduce internal stress therein; and patterning the X-ray absorbing layer to define a masking pattern.

* * * * *